US005225781A

United States Patent [19]
Glover et al.

[11] Patent Number: 5,225,781
[45] Date of Patent: Jul. 6, 1993

[54] ROBUST DECOMPOSITION OF NMR IMAGES BY CHEMICAL SPECIES

[75] Inventors: Gary H. Glover, Menlo Park, Calif.; Erika Schneider, New Berlin, Wis.

[73] Assignee: General Electric Company, Milwaukee, Wis.

[21] Appl. No.: 717,966

[22] Filed: Jun. 20, 1991

Related U.S. Application Data

[63] Continuation-in-part of Ser. No. 566,199, Aug. 10, 1990, Pat. No. 5,144,235.

[51] Int. Cl.⁵ ............................................. G01R 33/20
[52] U.S. Cl. ......................................................... 324/309
[58] Field of Search .............. 324/300, 307, 309, 311, 324/313, 318, 322

[56] References Cited

U.S. PATENT DOCUMENTS

| | | | |
|---|---|---|---|
| 5,134,372 | 7/1992 | Inoue | 324/309 |
| 5,144,235 | 9/1992 | Glover et al. | 324/309 |
| 5,162,737 | 11/1992 | Nozokido et al. | 324/309 |

OTHER PUBLICATIONS

"Simple Proton Spectroscopic Imaging", W. Thomas Dixon, Radiology, 1984; 153; 189-194.
"Fatty Infiltration of the Liver: Demonstration by Proton Spectroscopic Imaging", Joseph K. T. Lee, et al, Radiology 1984; 1535; 195-201.

*Primary Examiner*—Louis Arana
*Attorney, Agent, or Firm*—Quarles & Brady

[57] ABSTRACT

A method of separating fat and water proton NMR images in the presence of local magnetic field inhomogeneities uses multiple images with phase shift between the water and fat signals. The phase shifts need not be multiples of $\pi$ and are selected so that at least two images are not "fat opposed" and so that images are not symmetric in phase shift around a "fat aligned" image. A switch function is developed from the argument of the combined images to unambiguously identify the predominant chemical species of each voxel. Wrap arounds in the argument resulting from the limited range of trigonometric functions are treated first by subtracting a low order polynomial, then detecting and removing wrap around discontinuities.

6 Claims, 8 Drawing Sheets

FIG. 7
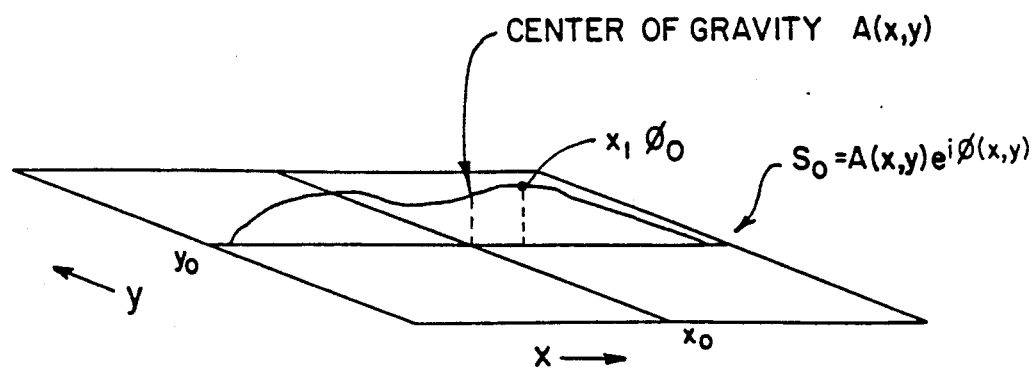
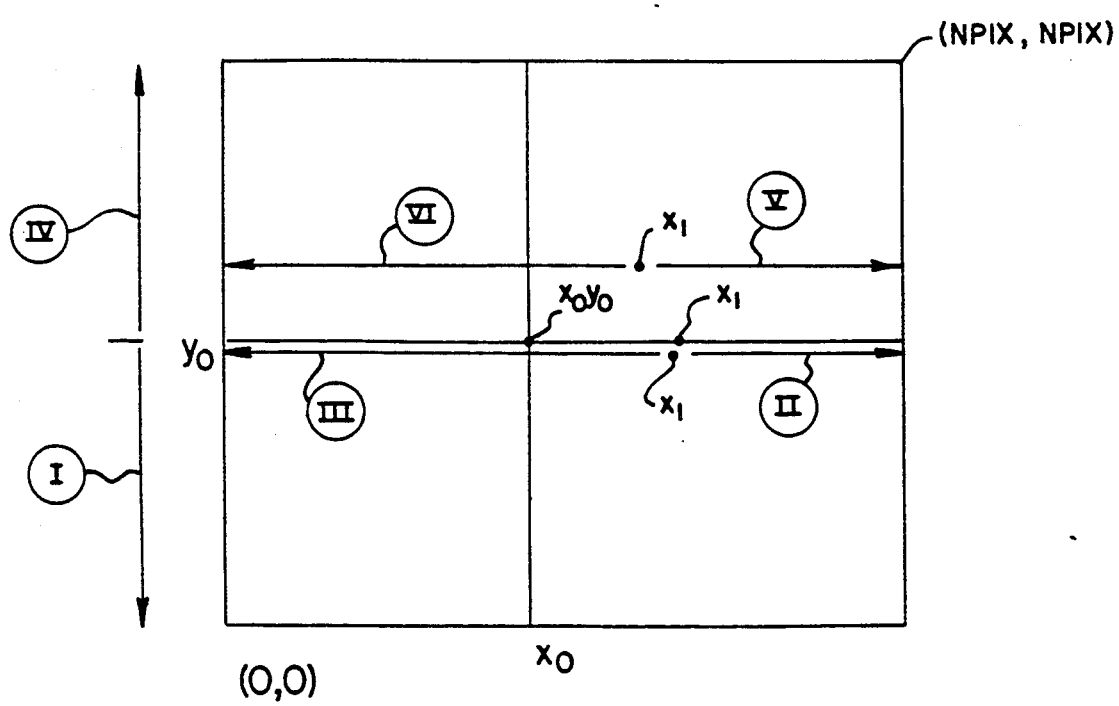
FIG. 8

ROBUST DECOMPOSITION OF NMR IMAGES BY CHEMICAL SPECIES

This is a continuation-in-part of application Ser. No. 07/566,199, filed Aug. 10, 1990, now U.S. Pat. No. 5,144,235.

BACKGROUND OF THE INVENTION

This invention relates to nuclear magnetic resonance (NMR) imaging methods and apparatus and more particularly to an improved method of producing separate images of different chemical species using such imaging methods.

A. NMR Imaging

In an NMR imaging sequence, a uniform magnetic field BO is applied to an imaged object along the z axis of a Cartesian coordinate system. The effect of the magnetic field $B_0$ is to align the object's nuclear spins along the z axis. In this field, the nuclei resonate at their Larmor frequencies according to the following equation:

$$\omega = \gamma B_0 \quad (1)$$

where $\omega$ is the Larmor frequency, and $\gamma$ is the gyromagnetic ratio which is a property of the particular nucleus. The nuclei respond to RF pulses at this frequency oriented within the x-y plane. Water, because of its relative abundance in biological tissue and the properties of its proton nuclei, is of principle concern in such imaging. The value of the gyromagnetic ratio $\gamma$ for protons in water is 4.26 kHz/Gauss and therefore in a 1.5 Tesla polarizing magnetic field $B_0$, the resonant or Larmor frequency of water protons is approximately 63.9 MHz.

Materials other than water, principally fat, are also to be found in biological tissue and have different gyromagnetic ratios. The Larmor frequency of protons in fat is approximately 203 Hz lower than that of protons in water in a 1.5 Tesla polarizing magnetic field $B_0$. The difference between the Larmor frequencies of such different isotopes or species of the same nucleus, viz., protons, is termed chemical shift, reflecting the differing chemical environments of the two species.

In the well known slice selective RF pulse sequence, a z axis magnetic field gradient $G_z$ is applied at the time of the RF pulse so that only the nuclei in a slice through the object in an x-y plane are excited. After the excitation of the nuclei, magnetic field gradients are applied along the x and y axes and an NMR signal is acquired. The gradient along the x axis, $G_x$, causes the nuclei to precess at different resonant frequencies depending on their position along the x axis; that is, $G_x$ spatially encodes the precessing nuclei by frequency. Similarly, the y axis gradient, $G_y$, is incremented through a series of values and encodes y position into the rate of change of phase as a function of $G_y$ gradient amplitude, a process typically referred to as phase encoding. From this data set an image may be derived according to well known reconstruction techniques. A general description of one such image reconstruction technique based on the Fourier transform is contained in the book "Magnetic Resonance Imaging, Principles and Applications" by D. N. Kean and M. A. Smith. Images in other orientations can be generated by rotation of the gradient directions, as is well known in the art.

B. Decomposition of NMR Images by Chemical Species

1. The "Dixon" Technique

Often it is desired to "decompose" the NMR image into its several chemical shift components. In the case of protons, which will be used hereafter for illustration, it may be desired to portray separate images of the water and fat components of the subject. One method of accomplishing this is to acquire two images $S_0$ and $S_{-1}$ with the fat and water components of the images in phase, and out of phase by $\pi$ radians, respectively (the "Dixon" technique). If the transmitter center frequency is adjusted to be equal to the water Larmor frequency, addition of these images provides a water-only image, while subtraction yields a fat-only image. The phase shift between the fat and water components in an image may be controlled by timing the RF pulses of the NMR sequence so that the signal from the fat image evolves in phase with respect to the signal from the water by an angle of $\pi$ (or an odd integer multiple of $\pi$), before the NMR signal is acquired.

In the ideal case above, the frequency of the RF transmitter is adjusted to match the Larmor frequency of the water. If the polarizing magnetic field $B_0$ is uniform, this resonance condition is achieved throughout the entire subject. Similarly, the out-of-phase condition (a phase shift of $\pi$ radians) for the fat component is achieved for all locations in the subject under homogeneous field conditions. In this case, the decomposition of the acquired images into the separate images of fat and water is ideal in that fat is completely suppressed in the water image, and vice versa.

When the polarizing field is inhomogeneous, however, there are locations in the subject for which the water is not "on resonance". In this case, the accuracy of the decomposition breaks down and the water and fat images contain admixtures of the two species. This derives from additional phase shifts of the NMR signal caused by the off resonance condition. The degree to which the off resonance condition holds is, in general, not known. The accuracy of such chemical shift "Dixon" techniques is therefore often unreliable.

Field inhomogeneities may result from improper adjustment or shimming of the polarizing magnetic field $B_0$, but are more typically the result of "demagnetization" effects caused by the variations in magnetic susceptibility of the imaged tissue, such as between soft tissue and air, or bone and soft tissue, which locally distort the polarizing magnetic field $B_0$. These off resonance effects may be of short spatial extent but of high magnitude, and therefore may not be removed by conventional linear or higher order shimming techniques.

2. The "Three Point Dixon" Technique

As described in co-pending application Ser. No. 07/566,199, entitled: "Method of Decomposing NMR Images by Chemical Species" and assigned to the same assignee as the present invention, the influence of off resonance may be accommodated by an imaging technique that uses three images $S_0$, $S_1$, and $S_{-1}$, with the phase evolution times adjusted so that the fat and water components of the images are in phase, out of phase by $\pi$, and out of phase by $-\pi$ respectively. The complex voxels in each of the three images after conventional reconstruction may be represented as follows:

$$S_0 = (\rho_1 + \rho_2)e^{i\phi_0} \tag{2}$$

$$S_1 = (\rho_1 - \rho_2)e^{i(\phi + \phi_0)} \tag{3}$$

$$S_{-1} = (\rho_1 - \rho_2)e^{-i(\phi - \phi_0)} \tag{4}$$

where $\rho_1$ is the (real) relaxation weighted spin density, and hence the amplitude of the voxel, contributed by the water component, $\rho_2$ is the (real) relaxation weighted spin density or amplitude of the voxel contributed by the fat component, and $\phi_0$ is the phase shift common to all acquisitions that is caused by RF heterogeneity due to penetration effects, phase shifts between the RF transmitter and receiver, and other systematic components. These effects are independent of chemical shift but dependent on spatial location. In images $S_1$ and $S_{-1}$ the amplitude of $\rho_2$ is negative because of the $\pi$ and $-\pi$ phases shift between the fat and water components as previously described. The phase shift $\phi$ is caused by the unknown resonance offset that results from $B_0$ heterogeneity. The phase offset $\phi_0$ may be eliminated from equations (2)–(4) from $S_0$, since the $\rho_i$ values are real quantities, by determining its argument $\phi_0$, i.e., $\phi_0 = \arg(S_0)$. The phase offset $\phi_0$ may then be eliminated from the equations (2)–(4) yielding:

$$S'_0 \equiv S_0 e^{-i\phi_0} = (\rho_1 + \rho_2) \tag{2'}$$

$$S'_1 \equiv S_1 e^{-i\phi_0} = (\rho_1 - \rho_2)e^{i(\phi)} \tag{3'}$$

$$S'_{-1} \equiv S_{-1} e^{-i\phi_0} = (\rho_1 - \rho_2)e^{-i(\phi)} \tag{4'}$$

The values of $\rho_1$ and $\rho_2$ may be determined from the measured values of $S'_0$, $S'_1$ and $S'_{-1}$ according to equations (2')–(4') as:

$$\rho_1 = (S_0' + s\sqrt{S_1' S_{-1}'})/2 \tag{5}$$

$$\rho_2 = (S_0' - s\sqrt{S_1' S_{-1}'})/2 \tag{6}$$

where s is a "switch function" which may be either $+1$ or $-1$ thus determining the sign of the square root. The value of the switch function is determined from the phase angle of a $B_0$ image obtained from a combination of the $S_1$ and $S_{-1}$ images, i.e. $S_1 S_{-}^*$.

A method for determining the value of the switch function s is described in detail in co-pending application Ser. No. 7/566,199 entitled: METHOD OF DECOMPOSING NMR IMAGES BY CHEMICAL SPECIES, filed Aug. 10, 1990, assigned to the same assignee as the present invention, and hereby incorporated by reference.

SUMMARY OF THE INVENTION

The above described three point Dixon method has a number of shortcomings in producing separate images of water and fat within a body. The first shortcoming is that the boundary areas between fat and water are poorly imaged. This is a particular concern because these boundary areas are a disproportionately important source of diagnostic information.

It has been determined that this imaging failure results from an indeterminacy of the $B_0$ image used to derive the switch function s referred to above. It is believed that image voxels spanning the boundary area between fat and water tissues produce both a water and fat signal which cancel each other and thus provide an indeterminate value of $\phi = \arg(S_1 S_{-1}^*)$ which is used to calculate the $B_0$ image. This indeterminacy will be termed *intravoxel cancellation*

A second shortcoming in the three point Dixon method is that it implicitly assumes that the amplitude of the fat and water components in each of the three signals $S_0$, $S_1$, and $S_{-1}$ is constant among images, thus the out of phase signal produced by one chemical species will exactly cancel the in-phase signal produced by that chemical species for a given voxel. It has been determined, however, that this assumption leads to significant errors in certain imaging applications such as where accurate quantitation of the fat and water is necessary, as for example, in bone marrow measurements. This problem will be termed *intravoxel amplitude loss.*

The present invention provides an improvement to the three point Dixon technique that: 1) eliminates the indeterminacy of the $B_o$ image at the boundaries between fat and water caused by intravoxel phase cancellation; 2) improves the accuracy of the decomposition by permitting the correction of intravoxel amplitude loss; and 3) provides a measure of the intravoxel amplitude loss. In one embodiment, in which three images are acquired, the amplitude loss caused by "susceptibility dephasing" may be modeled and corrected. In a second embodiment, in which four images are acquired, both susceptibility dephasing or field heterogeneity loss and "spectral width" amplitude loss may be modeled and corrected. These amplitude loss mechanisms will be described further below.

The present invention also recognizes a generalization of the Dixon decomposition techniques to images having arbitrary phase separation between their fat and water components.

Specifically, three complex NMR multi-voxel images of the body are acquired, the first and second chemical species having relative phase shifts in the three images such that at least two of the images have congruence in the signals produced by the first and second chemical species. Congruence will be defined as the quality possessed by an image in which the relative phase shift between the chemical species is not $\pi$ or an odd multiple of $\pi$. The phase shifts of these signals need not be multiples of $\pi$. The NMR images are combined to create a $B_0$ image and a low order surface is fit to the continuous portions of the $B_0$ image. The difference between the low order surface and the $B_0$ image are then measured and the phase of the $B_0$ image is corrected if the difference between adjacent voxels exceeds a predetermined value. Finally, the NMR multi-voxel images are combined to produce a first and second chemical species image using the corrected $B_0$ image to identify the predominant chemical species of each voxel in the chemical species images.

Thus it is one object of the invention to generalize the three point Dixon method to multiple image sequences of arbitrary phase angle. It is another object of the invention to eliminate the loss of border area voxel data resulting from multiple "non-congruent" images, as previously thought desirable, but in which the fat and water components cancel out causing a loss of critical image data.

In one embodiment, images of a first chemical species, a second chemical species, and field heterogeneity loss $A_s$ are produced by acquiring a first, second and third complex NMR multi-voxel image of the body where the first image has a phase shift of zero and the second and third images have phase shifts that are not negatives of each other.

It is another object of the invention, therefore, to provide additional imaging data by selecting phase angles between the images that are not symmetric about the $S_0$ image. By making such a selection, amplitude loss is preserved in the combining of the images used to perform the decomposition. The amplitude loss data may be used, for example, to provide an image of intravoxel amplitude loss.

In yet another embodiment images of a first and second chemical species, field heterogeneity loss $A_s$, and a spectral width loss $A_w$ of one chemical species are produced by acquiring a first, second, third, and forth complex NMR multi-voxel images of the body, the first image having a phase shift of zero and the second and third and fourth images having phase shift values that are not negatives of each other. These images are then combined to produce images of a first and second chemical species density, intravoxel amplitude loss and spectral broadening loss.

It is thus another object of the invention to provide additional spectral width dephasing information by acquiring an additional image also not symmetric with respect to the other images. This additional image allows amplitude loss caused by field intravoxel heterogeneity to be separated from that caused by spectral width of one of the chemical species.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 7 is a three dimensional graph of the image $S_{0'}$ along one y line showing the center of gravity and the maximum point $x_1$ used with the method of FIG. 5;

FIG. 8 is a graph of the image space of the image shown in FIG. 7 showing the direction of unwrapping from the center of gravity of the image at $x_0$ and $y_0$.

DETAILED DESCRIPTION OF THE INVENTION

A. NMR Imaging Apparatus

Figure 1:
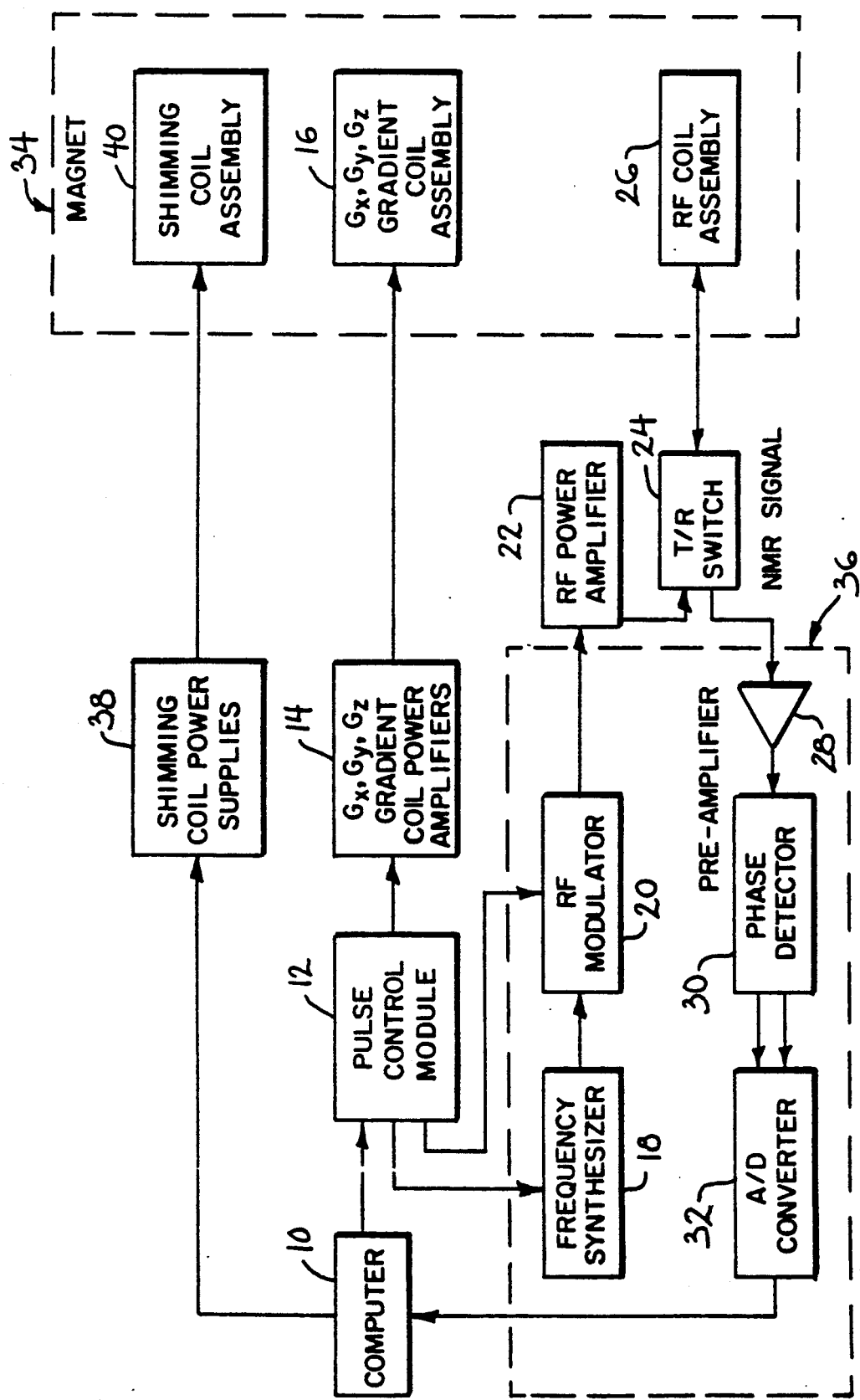
FIG. 1 is a schematic block diagram of an NMR system.

Referring to FIG. 1, an NMR imaging system of a type suitable for the practice of the invention includes a computer 10 which controls gradient coil power amplifiers 14 through a pulse control module 12. The pulse control module 12 and the gradient amplifiers 14 together produce the proper gradient waveforms $G_x$, $G_y$, and $G_z$, as will be described below, for either a spin echo or a gradient recalled echo pulse sequence. The gradient waveforms are connected to gradient coils 16 which are positioned around the bore of the magnet 34 so that gradients $G_x$, $G_y$, and $G_z$ are impressed along their respective axes on the polarizing magnetic field BO from magnet 34.

The pulse control module 12 also controls a radio frequency synthesizer 18 which is part of an RF transceiver system, portions of which are enclosed by dashed line block 36. The pulse control module 12 also controls a RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object.

B. NMR Pulse Sequence

The following discussion considers a spin echo pulse sequence and a gradient echo sequence produced on the above described apparatus and suitable for use with the present invention. It should be understood, however, that the invention may be used with other pulse sequences as will be apparent to one skilled in the art.

Figure 2:
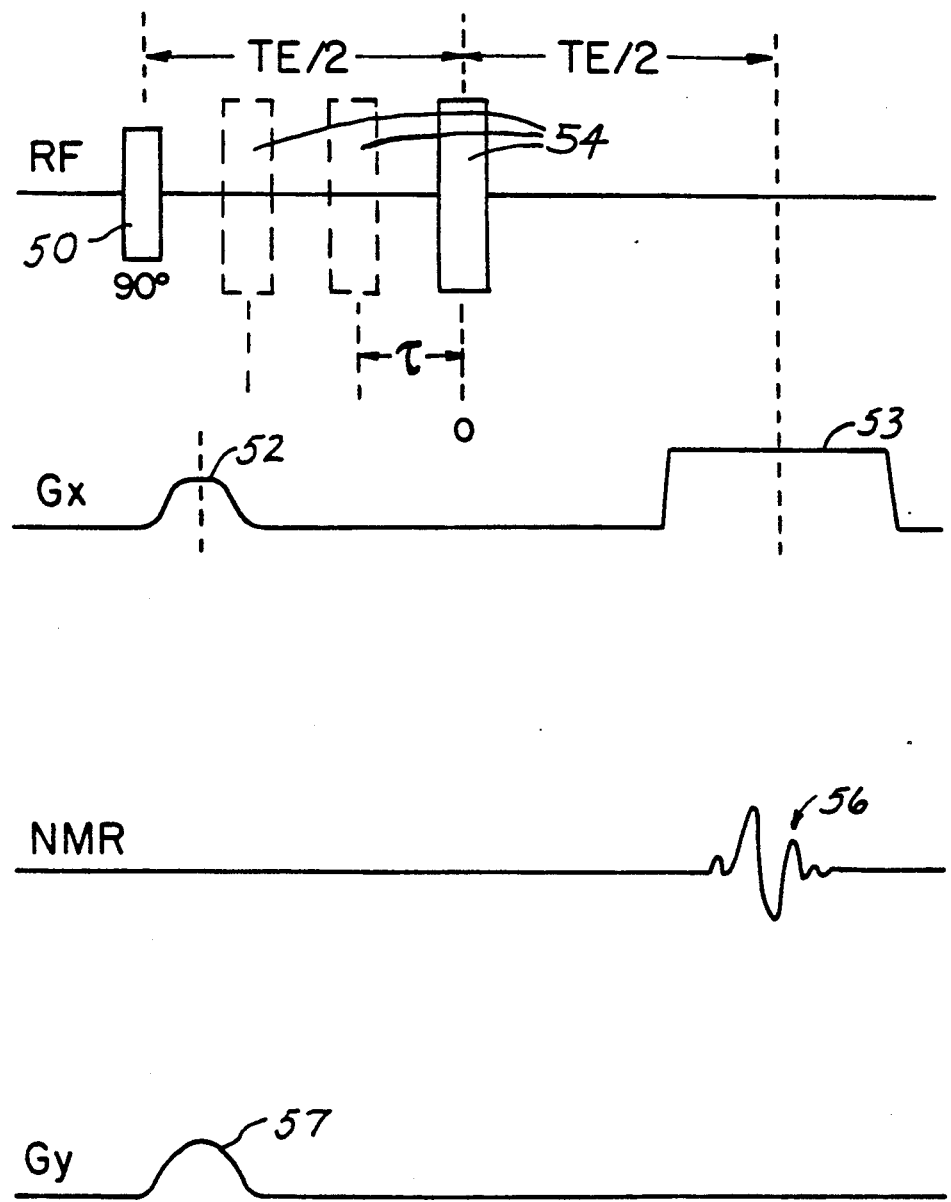
FIG. 2 is a graphic representation of a spin echo NMR pulse sequence such as may be produced on the NMR system of FIG. 1 and is suitable for use with the present invention.

Referring to FIG. 2, a spin echo pulse sequence begins with the transmission of a narrow bandwidth radio frequency (RF) pulse 50. The energy and the phase of this initial RF pulse 50 may be controlled such that at its termination, the magnetic moments of the individual nuclei are precessing around the z axis within the x-y plane. A pulse of such energy and duration is termed a 90° RF pulse.

The result of a combination of RF pulse 50 and a z axis gradient pulse $G_z$ (not shown) is that the nuclear spins of a narrow slice in the imaged object along an x-y plane are excited into resonance. Only those spins with a Larmor frequency, under the combined field $G_z$ and $B_0$, equal to the frequencies of the RF pulse 50 will be excited. Hence the position of the slice may be controlled by the gradient $G_z$ offset or the RF frequency.

After the 90° RF pulse 160, the precessing spins begin to dephase according to their chemical shifts which cause the spins of certain chemical species to precess faster than others and the action of the applied gradients which cause spatially dependent off resonance conditions. At time TE/2 after the application of 90° RF pulse 50, a 180° RF pulse 54 may be applied which has the effect of rephasing the spins to produce a spin echo 56 at time TE after the 90° RF pulse 50. This spin echo signal 56 is acquired during a read out gradient 53.

As is understood in the art, a dephaser pulse 52 is applied after the 90° RF pulse but before the read out gradient to center the spin echo within the read out gradient With the 180° RF pulse 54 centered at time TE/2, any constant off resonance-induced phase shifts, including the chemical shift of fat relative to water, will be completely rephased at the time of the spin echo 56. This timing produces an $S_0$ signal which, consequently, will have no off resonance phase encoding. The time of the 180° pulse 54, however, may be shifted forward or back by time $\tau$ from the time TE/2. In this case, the fat and water proton spins will not be in phase but will be shifted with respect to each other by $2\tau\omega_{cs}$, where $\omega_{cs}$ is the difference in Larmor frequencies between water and fat. The value of the phase shift between the fat and water images caused by their chemical shift will be designated $\theta$. At the same time, any constant resonance offset $\omega_0$ will be phase encoded by an amount $\phi = 2\omega\tau$.

Figure 9:
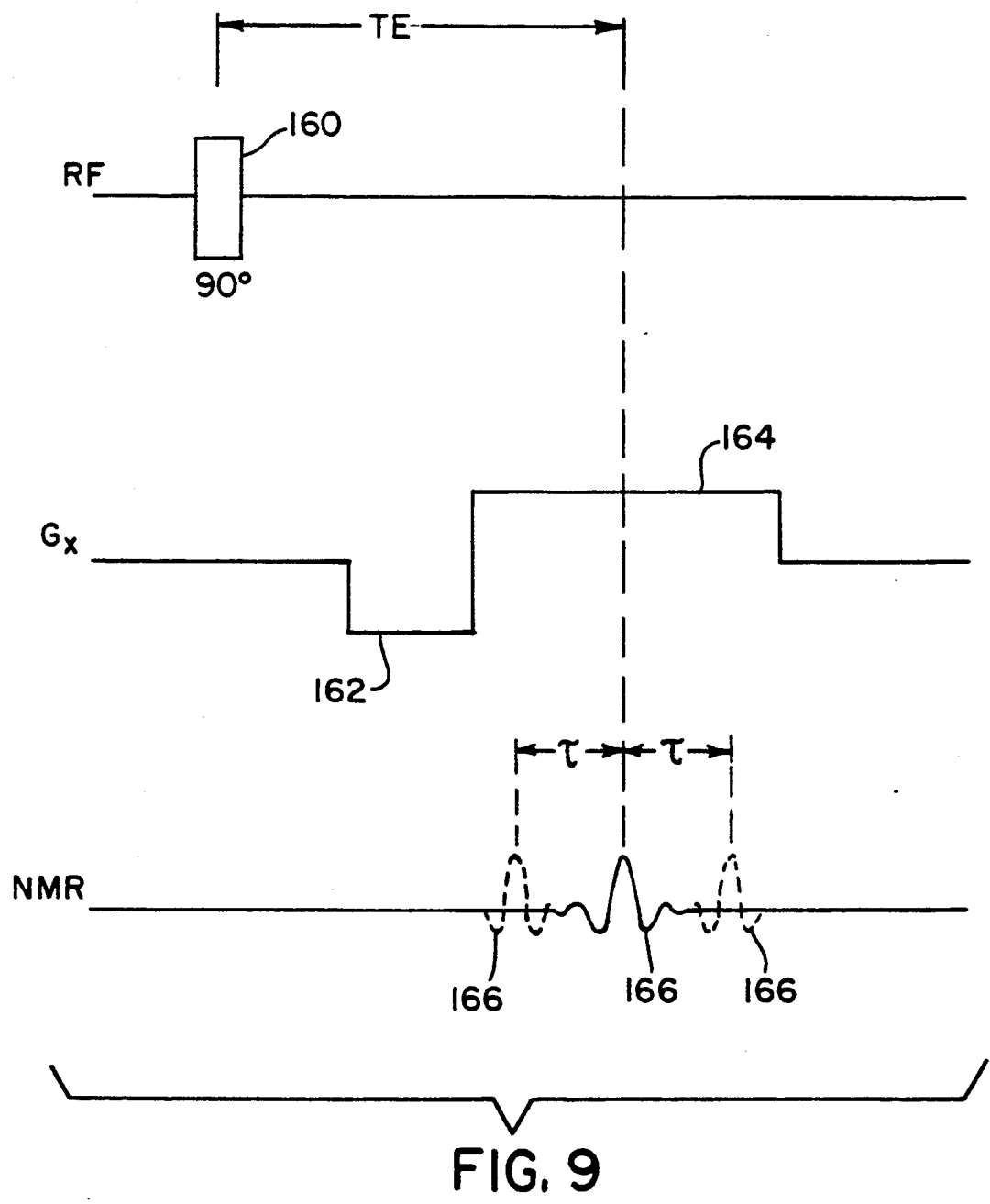
FIG. 9 is a graphic representation of a gradient echo NMR pulse sequence such as may be produced on the NMR system of FIG. 1 and also suitable for use with the present invention.

Referring to FIG. 9, a gradient echo pulse sequence also begins with the transmission of a narrow bandwidth radio frequency (RF) pulse 160 similar to pulse 50, described above, and combined, as before, with a gradient pulse $G_z$ (not shown) so that the nuclear spins of a narrow slice in the imaged object along an x-y plane are excited into resonance.

After the 90° RF pulse 160, the precessing spins begin to dephase according to their chemical shifts which cause the spins of certain chemical species to precess faster than others. A rewinder pulse 162, as is understood in the art, is then applied on the $G_x$ gradient to prepare the spins for the readout gradient 164 which causes a gradient recalled echo 166 centered at time TE after the application of 90° RF pulse 160 where TE is chosen so that the fat and water spins are aligned. This may be assured if TE = $n2\pi/\omega_{cs}$, where n is an integer, and $\omega_{cs}$ is the difference in Larmor frequencies between water and fat. The acquisition centered at time TE produces the $S_0$ signal. The time of acquisition, however, may be shifted forward or back by time $\tau$ from the time TE. In this case, the fat and water proton spins will not be in phase but will be shifted with respect to each other by $\tau\omega_{cs}$. The value of the phase shift between the fat and water images caused by their chemical shift will be designated $\theta$.

The above sequences are repeated with different $G_y$ gradient pulses 57, as is understood in the art, to acquire multiple NMR data sets from which a tomographic images $S_n$ of the imaged object may be reconstructed according to conventional reconstruction techniques using the Fourier transform.

1. General Description of the Invention

In the prior art three point Dixon method, three images $S_n$ were developed, having phase shift values $\theta$ between the water and fat components, as follows: 1) $S_0$ where $\theta = 0$, 2) $S_1$ where $\theta = \pi$, and 3) $S_{-1}$ where $\theta = -\pi$. The $S_0$ image having the fat and water signals in phase will be termed the "fat aligned" signal, and the $S_1$ and $S_{-1}$ images having the fat and water signals separated by $\pi$ radians will be termed the "fat opposed signals".

Although generally, it was understood to those of ordinary skill in the art, that a variety of images S could be employed in the Dixon techniques provided at least one image were fat opposed and one image were fat aligned, it was believed that phase shift values $\theta$ of $-\pi$, 0, and $+\pi$ were preferred because of acquisition efficiencies resulting from the obtaining of the two fat opposed images, $S_1$ and $S_{-1}$ clustered closely around the fat aligned image, $S_0$.

The present invention recognizes, first, that by having two of the three images acquired be fat opposed images, a severe loss of information results for voxels in which both tissues containing fat and water are present. In such voxels, which are frequently on the diagnostically significant border between tissues containing fat and water, the fat opposed images, $S_1$ and $S_{-1}$, produce no signal because the fat phase component cancels the water phase component. The $B_0$ image, derived from $S_1$ and $S_{-1}$, specifically $\arg(S_1 S_{-1}^*)$ will be undefined for those voxels because both $S_1$ and $S_{-1}$ have zero amplitude and thus indeterminate phase at those voxels. This confounds the determination of the switch function s described above.

The first aspect of the present invention, therefore, is that the image sequence uses at least two images that are not fat opposed. This eliminates the loss of $B_0$ information for border voxels.

The present invention also recognizes that images other than the $S_0$ image with equal but opposite phase shift values $\theta$ (symmetrical phase shifts) should have redundant amplitude information. However, due to changes in echo time, amplitude loss occurs ($T'_2$ loss). Thus the additional images may be used to recover this amplitude loss information. Without correcting for amplitude loss, errors in the decomposition process result. (Uncorrected amplitude loss prevents signals, that otherwise should cancel exactly, from cancelling.) The use of an asymmetrical images sequence $S_0$, $S_1$, and $S_2$ provides this additional amplitude loss information as will be described below.

2. Image Acquisition

The present invention also recognizes that the phase shift values of $\theta$ for each of the images S used in the decomposition process need not be integral multiples of $\pi$. In fact, the three images $S_n$ need not include, strictly, a fat opposed and fat aligned image.

For a generalized three image acquisition, the complex voxels in each of the three images after conventional reconstruction may be represented as follows:

$$S_n = [A_1\rho_1 + A_2\rho_2 e^{in\theta}]e^{i(n\phi + \phi_0)} \quad (7)$$

where $\rho_1$ is the (real) relaxation weighted spin density and hence the amplitude of the voxel contributed by the water component, $\rho_2$ is the (real) relaxation weighted spin density or amplitude of the voxel contributed by the fat component, and $\phi_0$ is the phase shift common to all acquisitions that is caused by RF heterogeneity due to penetration effects, phase shifts between the RF transmitter and receiver, and other systematic components. These effects are independent of chemical shift but may be dependent on spatial location. The phase shift $\phi$ is caused by the $B_0$ field, including $B_0$ heterogeneity and is equal to $2\omega_0\tau$ where $\omega_0$ is the resonance offset of the $\rho_1$ spins in the field $B_0$ and $\rho$ is the displacement of the 180° RF pulse 54 as described above.

Referring to equation (7), the value of $\phi_0$ may be determined and eliminated from each image by evaluating the argument of image $S_0$ as described above in connection with the three point Dixon method. Therefore equation (7) presents five unknown values:

$\rho_1$, $\rho_2$, $A_1$, $A_2$, and $\phi$.

The values $A_1$ and $A_2$ represent amplitude loss factors, unaccounted for in the Dixon methods described above. The amplitude loss in each image is thought to derive from two principal effects: 1) susceptibility induced dephasing of the spins during the imaging process, and 2) spectral breadth dephasing resulting from the finite width spectrum of each chemical species. Each of these mechanisms will be described in detail below.

a. Susceptibility Dephasing

Stationary gradients $G_s$ can be set up by susceptibility variations in the tissue microstructure. If these gradients have sufficiently short range, they may cause signal cancellation within a voxel by inducing a multiplicity of Larmor frequencies in the voxel. This mechanism acts jointly on the admixture of the two chemical species, so that the susceptibility induced amplitude loss ("$A_{1s}$" and "$A_{2s}$") is:

$$A_{1s} = A_{2s} \equiv A_s = \int_{-\infty}^{\infty} \chi(\omega) e_n^{i\omega\tau} d\omega / \int_{-\infty}^{\infty} \chi(\omega) d\omega \quad (9)$$

where $\chi(\omega)$ is the spectral distribution of frequencies within a voxel caused by the local susceptibility induced gradient $G_s$. This may be written:

$$A_s(\tau) = \chi(\tau)/\chi(o) \quad (10)$$

where $\chi = F(\chi)$, in which F denotes the Fourier transform.

It will be assumed that $\chi(\omega)$ is a Lorentzian distribution; therefore $$A_1(\tau) = e^{-|\tau|/T_2'} \quad (11)$$

where $1/T_2'$ is the characteristic half-width of the spectrum $\chi$. $T_2'$ is the susceptibility dephasing time which represents the field heterogeneity loss component of $T_2^*$ according to $1/T_2^* = 1/T_2 + 1/T_2'$ as is well understood to those of ordinary skill in the art.

The assumption of a Lorentzian line shape is not essential, but it is convenient, for it allows one to use $A_{1s}$ as a measure of $T_2'$.

Thus, susceptibility dephasing gives rise to an amplitude loss that is common to signals from both chemical species but which depends on $\tau$. An image of susceptibility dephasing will indicate the intravoxel field homogeneity.

b. Spectral Breadth Dephasing

If the spectra of the two chemical species have finite linewidths, a loss of coherence will occur similar to the mechanism described above. Thus an amplitude loss factor $A_{kw}$, for $k=1$ or 2 corresponding to each species, resulting from the finite linewidth may be given as:

$$A_{kw}(\tau) = \int_{-\infty}^{\infty} L_k(\omega) e^{i\omega\tau} d\omega / \int_{-\infty}^{\infty} L_k(\omega) d\omega \quad (13)$$

where $L(\omega)$ is the spectral distribution of frequencies within a voxel caused by the line width. This may be written:

$$A_{kw}(\tau) = L(\tau)/L(0) \quad (14)$$

where $L = F(L)$, in which F denotes the Fourier transform.

It has been found experimentally that for in vivo scanning of human subjects, voxels containing primarily water suffer little attenuation loss, while voxels containing primarily fat have observable loss. One may infer, therefore, that the water spectra has a sharp line and $L_1(\omega) = \delta(\omega)$, ($\delta(\omega)$ being the delta function, i.e. an infinitesimally thin line of area equal to 1) so that $A_{1w} = 1$. The fat resonance, however, contains several components and it is not unreasonable to model its spectrum as broadened. For a Gaussian fat spectrum with half width $\Delta\omega$, $$A_{2w}(\tau) = e^{-(\Delta\omega\tau)^2/4} \quad (15)$$

In general all of the above described loss mechanisms could be operable. In this case, the total loss is obtained by multiplying all terms together:

$$A_k = A_{kd} A_{ks} A_{kw} \quad k=1,2 \quad (16)$$

3. An Improved Three Point Technique

In a first embodiment of the present invention, the assumption is made that spectral breadth dephasing is negligible. Therefore, $A_1$ equals $A_2$ equals A. Three images are selected, $S_0$ and two other images having relative phase angles produced by adjusting $\tau$ so that neither of the other two images are symmetric around $S_0$. Symmetry will be defined as phase shift values of $\theta$, which are equal magnitude but opposite in sign. This lack of symmetry preserves the amplitude loss information.

Also at least one of the other two images is selected to have some degree of "congruency" between its fat and water components. Congruency as defined is the quality possessed by an image $S_n$ which is not perfectly fat opposed. That is where $\theta$ is not an odd multiple of $\pi$. As will be shown, the quality of congruency allows the value of A to be determined for equation (7) above and will improve the determinacy of the $B_0$ map used to compute $\phi$. Although any images which meet the above criteria of asymmetry and congruency may be used, including images having phase shifts $\theta$ between their fat and water components not integer mulitples of $\pi$, for computational simplicity, the images will be selected to have phase shift values of $\theta$ based on multiples of $\pi$.

Referring to equation (7), three images $S_n$ having asymmetry, and congruency in at least two of the images, may be generated by selecting $\tau$ to produce the phase shift values $\theta$ of 0, $\pi$, and $2\pi$ as follows:

$$S_0 = (\rho_1 + \rho_2) e^{i\phi_0} \quad (17)$$

$$S_1 = (\rho_1 - \rho_2) A e^{i(\phi + \phi_0)} \quad (18)$$

$$S_2 = (\rho_1 + \rho_2) A^2 e^{i(2\phi + \phi_0)} \quad (19)$$

Unlike the three point Dixon method discussed above, the value of A now may be readily determined, remembering that the values of $\rho$ are real, as:

$$A = \sqrt{\frac{|S_2'|}{|S_0|}} \tag{20}$$

where $|S_2|$ and $|S_0|$ are the magnitudes of $S_2$ and $S_0$ respectively.

Also, the value of $\phi$ and may be determined from $S_2$ and $S_0$ as follows:

$$2\phi = arg(S_2) - arg(S_0) \tag{21}$$

Because both $S_2$ and $S_0$ have congruence between their fat and water portions, the value of $\phi$ will be defined for voxels in the border area between fat and water. With the values of A and $\phi$ known, $\rho_1$ and $\rho_2$ may be determined as follows:

$$\rho_1 = \frac{(|S_0| + |S_2|) + 2S_1'e^{-i\phi}}{4} \tag{22}$$

$$\rho_2 = \frac{(|S_0| + |S_2|) - 2S_1'e^{-i\phi}}{4} \tag{23}$$

a. Resolving Ambiguities in $\phi$

Note that value of $\phi$ is not uniquely determined from equation (21) result of the periodicity of trigonometric functions, in particular the arctangent function, used to deduce the arguments of $S_0$ and $S_2$ from their quadrature components. For angles $\phi$ greater than $\pi/2$ or less than $-\pi/2$, $\phi_m$, the "measured" phase from equation (21) "wraps around" and $\phi$, the actual phase, is therefore ambiguous.

Figure 4A:
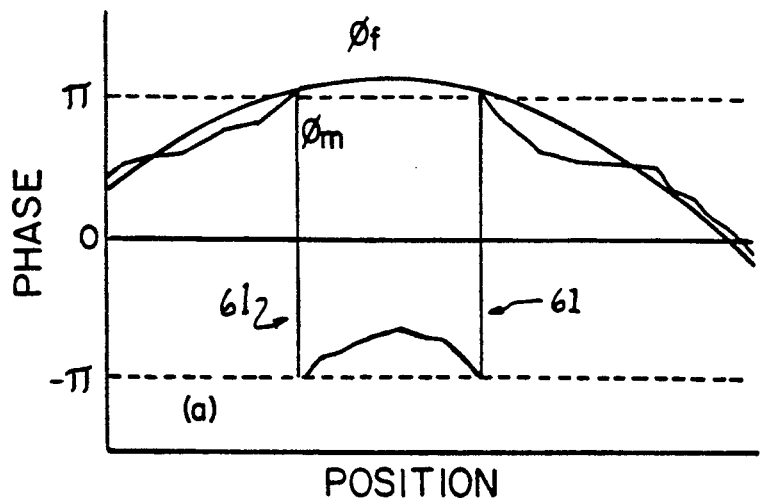
FIG. 4(a) is a plot of a single line of the $B_0$ image $\phi_m$ prior to the first stage of the correction method of the present invention and showing the fitted curve $\phi_f$.

As shown in FIG. 4(a), this wrap around 61 occurs at $\phi m = \pi$ and $\phi m = -\pi$ per equation (21). In general, this range of $\pi$ to $-\pi$ is too restrictive for imaging purposes as it requires that the frequency shift caused by changes in $B_0$ be less than $\pm\omega_{cs}/2$, the chemical shift.

The wrap arounds 61 are removed by a two stage process, the first stage as shown in FIGS. 3 and 4(a)-(c) and the second stage shown in FIGS. 5-8.

b. Phase Correction by Polynomial Subtraction

Figure 3:
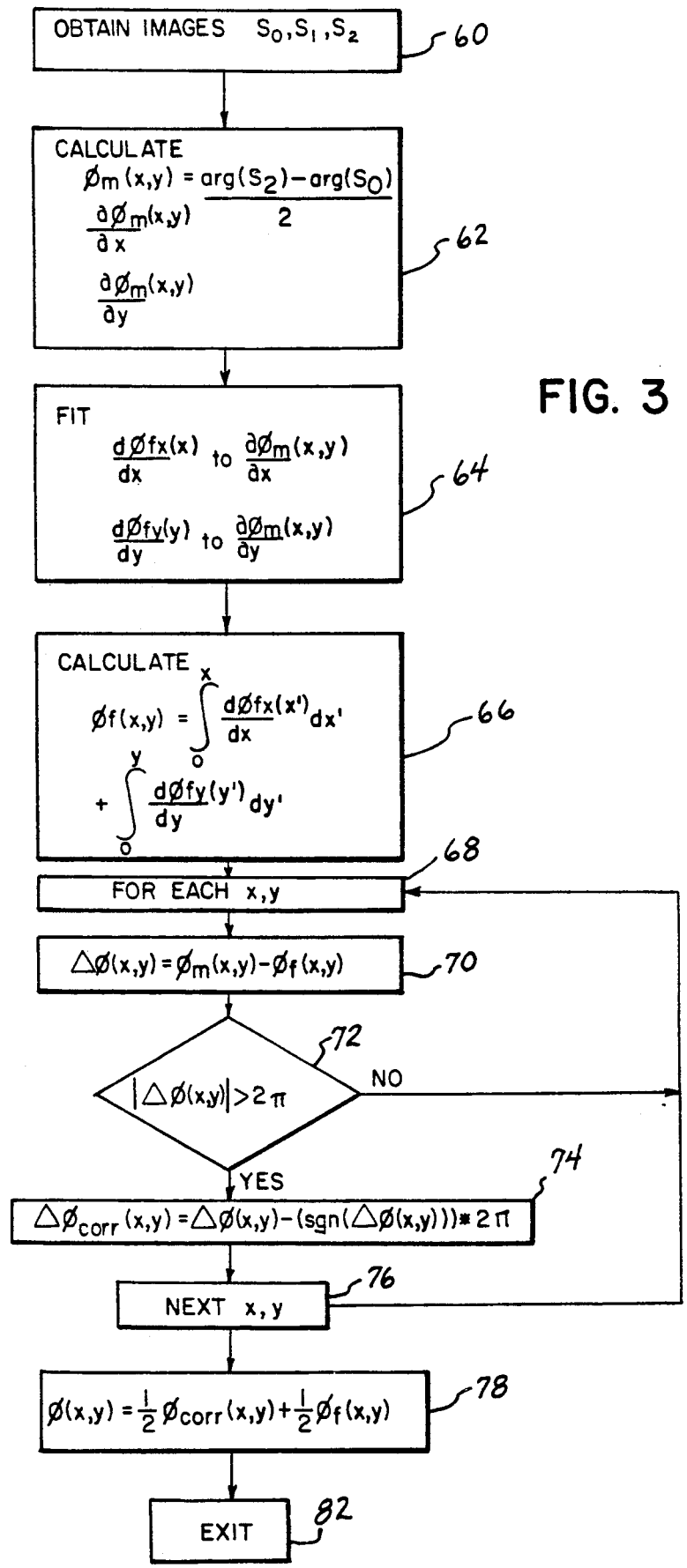
FIG. 3 is a flow chart showing the first stage of the method of the present invention for correcting the phase of the $B_0$ image so as to determine a switch function.

Referring still to FIG. 3, as indicated by process block 62, the $B_0$ image indicated by $\phi_m$ is differentiated to produce differentiated images $$\frac{\partial \phi_m}{\partial x}, \frac{\partial \phi_m}{\partial y}.$$

In the differentiated images, the wrap arounds 61 will appear as large magnitude, narrow spikes which are readily identified by a thresholding process and given zero weight in the curve fitting to be described below.

A polynomial $\phi_f$ of the form:

$$\phi_{fx}(x) = p_3(x-x_0)^3 + p_2(x-x_0)^2 + p_1(x-x_0) + p_0 \tag{24}$$

is differentiated to produce:

$$\frac{d\phi_{fx}}{dx}(x) = 3p_3(x-x_0)^2 + 2p_2(x-x_0) + p_1 \tag{25}$$

which is fit to the derivative of $\phi_m$ with respect to the x axis as indicated by process block 64. The value $x_0$ and corresponding value $y_0$ are the coordinates of the center of gravity of the image as will be described further below. This curve fitting is done by the weighted least squares method as is well understood in the art, where the weighting is a function of the amplitude of the $S_0'$ image at the particular voxel times the weighting produced by the thresholding process described immediately above. Coefficients are determined by averaging over all y-lines to produce the coefficients $p_3$, $p_2$, and $p_1$. The process is then repeated for lines of constant x value using the polynomial:

$$\frac{d\phi_{fy}}{dy}(y) = 3q_3(y-y_0)^2 + 2q_2(y-y_0) + q_1 \tag{26}$$

At process block 66 the fit functions $$\frac{d\phi_{fx}}{dx}(x), \frac{d\phi_{fy}}{dy}(y)$$

are integrated to determine the coefficients of a third order polynomial $\phi_f$ of the form:

$$\phi_f(x,y) = a_3(x-x_0)^3 + a_2(x-x_0)^2 a_1(x-x_0) + b_3(y-y_0)^3 + b_2(y-y_0)^2 + b_1(y-y_0) + c \tag{27}$$

The value c is set equal to $\phi_m(x_0,y_0)$. This polynomial surface conforms to the undifferentiated $B_0$ image $\phi_m$ without regard to the wrap arounds 61 as shown in FIG. 4(a).

Process blocks 68 and 76 together form a loop containing process blocks 70-74 which sequentially correct each voxel of the $B_0$ image.

At process block 70, a difference function $\Delta\phi$ is computed as follows:

$$\Delta = \phi_m - \phi_f \tag{28}$$

Figure 4B:
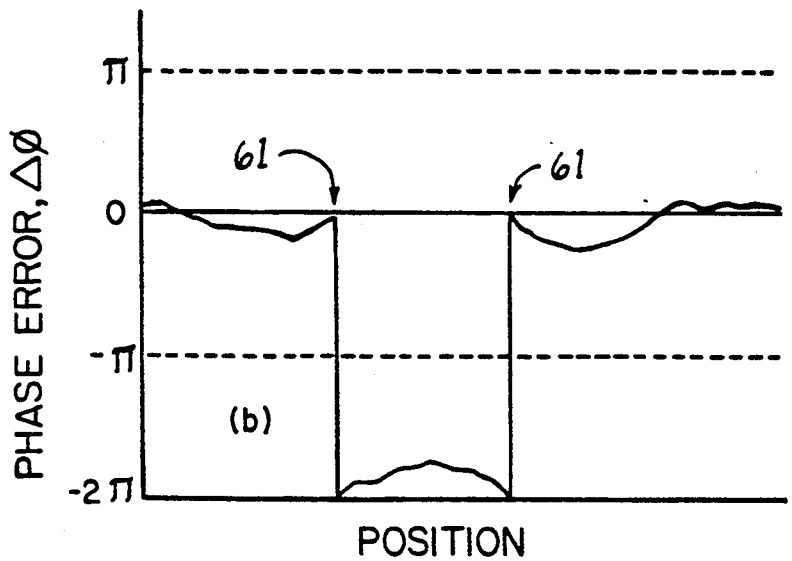
FIG. 4(b) is a plot of a single line of the difference function $\Delta\phi$ equal to the $B_0$ image $\phi_m$ after subtraction of the curve $\phi_f$ and unambiguously showing the wrap around of $\phi_m$.
Figure 4C:
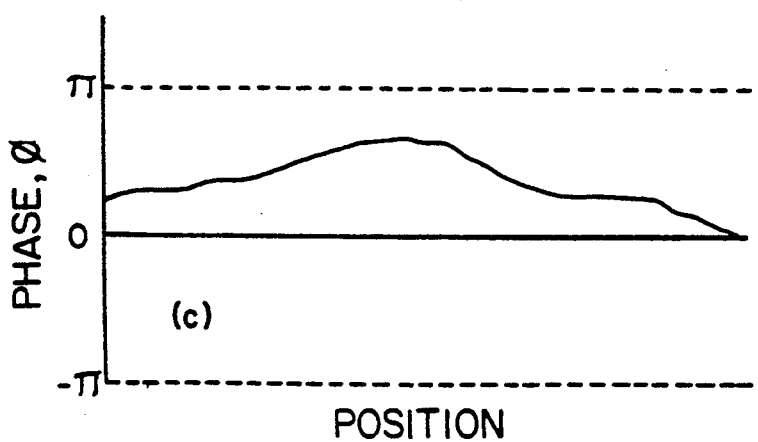
FIG. 4(c) is a plot of a single line of the corrected $B_0$ image $\phi_{corr}$ after correction by the first stage of the method of the present invention.

As shown in FIG. 4(b) in the function $\Delta\phi(x,y)$ the wrapped around points 61 are now unambiguous and may be detected at decision block 72 which identifies segments of $\Delta\phi$ having magnitudes of greater than $2\pi$, which are corrected at process block 74 by adding or subtracting $2\pi$ to the values of these segments depending on the sign of $\Delta\phi$ at these segments. A corrected image $\phi_{corr}$ is produced equal to $\Delta\phi$ without the wrap arounds 61. To determine $\phi$, the corrected image $\phi_{corr}(x,y)$ is halved and $$\frac{\phi_f(x,y)}{2}$$

is added at each voxel at process block 78 in accordance with equations 11 and 15 to produce phase image $\phi$ as shown in FIG. 4(c).

The above described method of determining the phase image $\phi(x,y)$ may fail for certain $B_0$ areas where the fit function $\phi_f(x,y)$ is not able to follow the spatially rapid phase changes or when the wrap arounds 61 of phase go beyond $2\pi$. For these reasons, the phase image $\phi(x,y)$ produced by the above described first stage is operated on by a second stage of the process as will now be described.

c. Phase Correction Using Trend Analysis

In the second stage, the phase of each voxel of the phase image is predicted by an exponential prediction based on the previous voxels. Deviations between the prediction and the actual measured phase are used to detect previously undetected wrap around points 61 and the "wrapped around" voxels are "unwrapped" by adding or subtracting $2\pi$.

Figure 5:
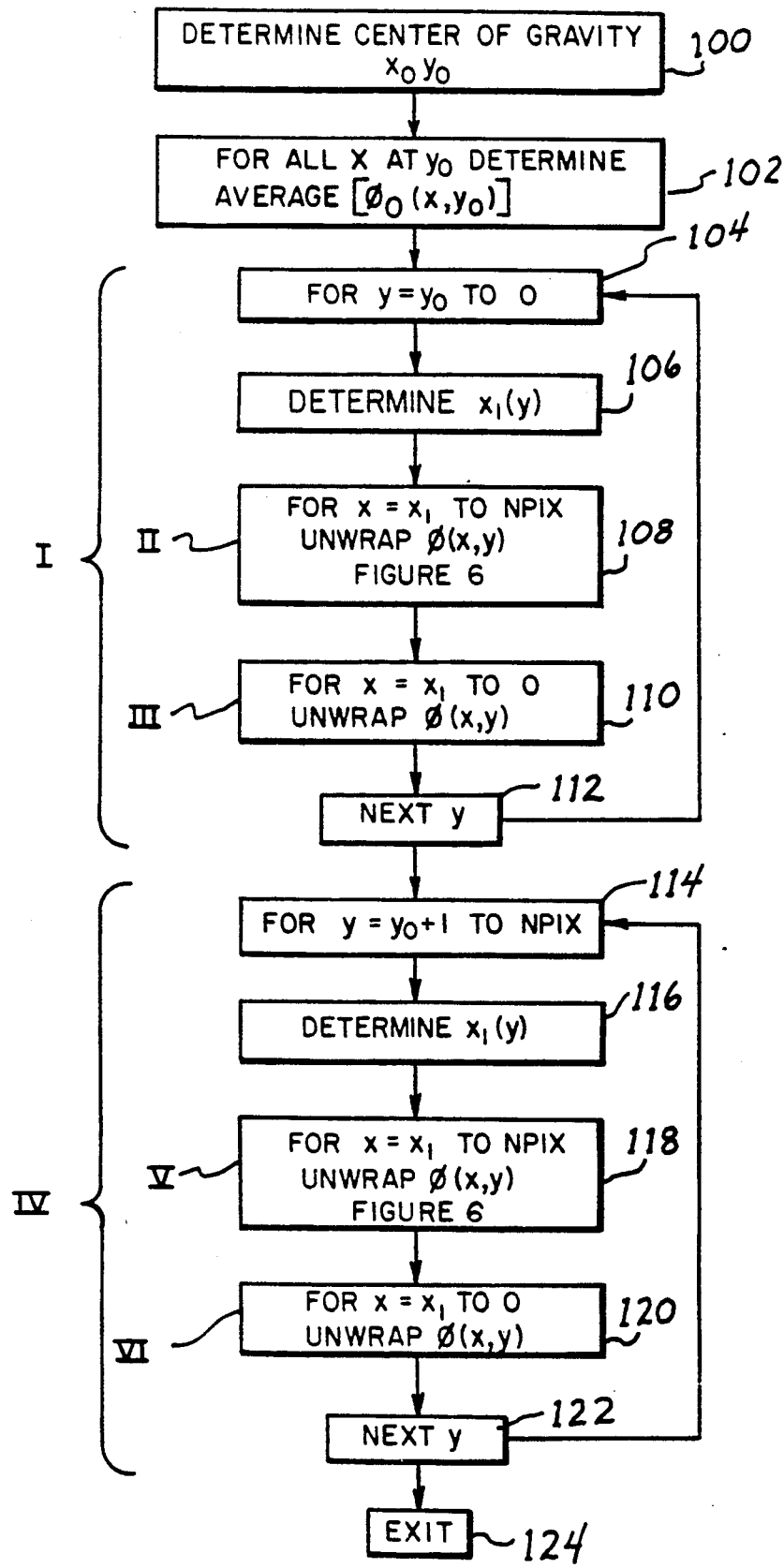
FIG. 5 is a flow chart showing the second stage of the method of the present invention for correcting the $B_0$ image to be used to determine a switch function.

Referring to FIG. 5 and 7, in the first step of the second stage, as indicated by process block 100, the center of gravity $(x_0, y_0)$ of the amplitude of the $S_{0'}$ image is found.

Specifically $x_0$ and $y_0$ are calculated where:

$$x_0 = \frac{\int |S_{0'}| \, x \, dx dy}{\int |S_{0'}| \, dx dy} \quad (29)$$

and $$y_0 = \frac{\int |S_{0'}| \, y \, dx dy}{\int |S_{0'}| \, dx dy} \quad (30)$$

The point of maximum phase, $x_1$, along the line of constant y intersecting the center of gravity ("$y_0$-line"), is then identified and the value of $\phi(x, y_0)$ along this line is determined as follows. Starting at the voxel of maximum intensity at $y_0$, $(x_1, y_0)$, as the current voxel, the average phase in a 3 by 3 voxel matrix $(x_1-1 \leq x \leq x_1+1, y_0-1 \leq y \leq y_0+1)$ is determined by averaging. Care is taken to avoid wrap around discontinuities by performing a second average with $\pi$ offset added to each voxel, adjusting the result to within the range of $\pm\pi$ by adding or subtracting $2\pi$ in a manner analogous to steps 70, 72, and 74, and choosing the average with the smallest $\chi^2$ fit to a planar surface defined by the previous averages. The value of the phase determined by this method becomes the starting phase $\phi_0$ for voxel $x_1$, $y_0$.

Progressive y-lines are then unwrapped starting from the line at $y_0$ and at point $x_1$ for that line. Referring to FIG. 8, these lines are analyzed at and below the $y_0$-line per the loop formed by process blocks 104 and 112 which sequentially decrements the y value of the line to be unwrapped. Again the maximum phase value $x_1$ on each line is determined as indicated by process block 106 within this loop and the line is unwrapped from the voxel $x_1$ rightward to the image boundary as indicated by arrow II of FIG. 8, and by process block 108 of FIG. 5, and then leftward from voxel $x_1$ as indicated by arrow III of FIG. 8 and process block 110 of FIG. 5. The next lower y-line is then unwrapped and the process is repeated proceeding in the direction shown by arrow I of FIG. 8 according to the loop of process blocks 104 and 112 of FIG. 5 as previously described.

When the lower portion of the image is unwrapped, successive y-lines above the $y_0$-line are unwrapped according to a loop formed by process blocks 114 and 122 of FIG. 5. The center of gravity and the maximum phase value xl on each line is determined as indicate by process block 116. For each such y-line the phase is unwrapped first along the direction indicated by arrow V of FIG. 8 away from voxel xl according to process block 118 of FIG. 5, and then in the direction indicated by arrow VI of FIG. 8 according to process block 120 of FIG. 5. The process is repeated for higher y-lines as indicated by arrow IV of FIG. 8 according to the loop of process blocks 114 and 122 of FIG. 5 until the upper edge of the image is reached.

Figure 6:
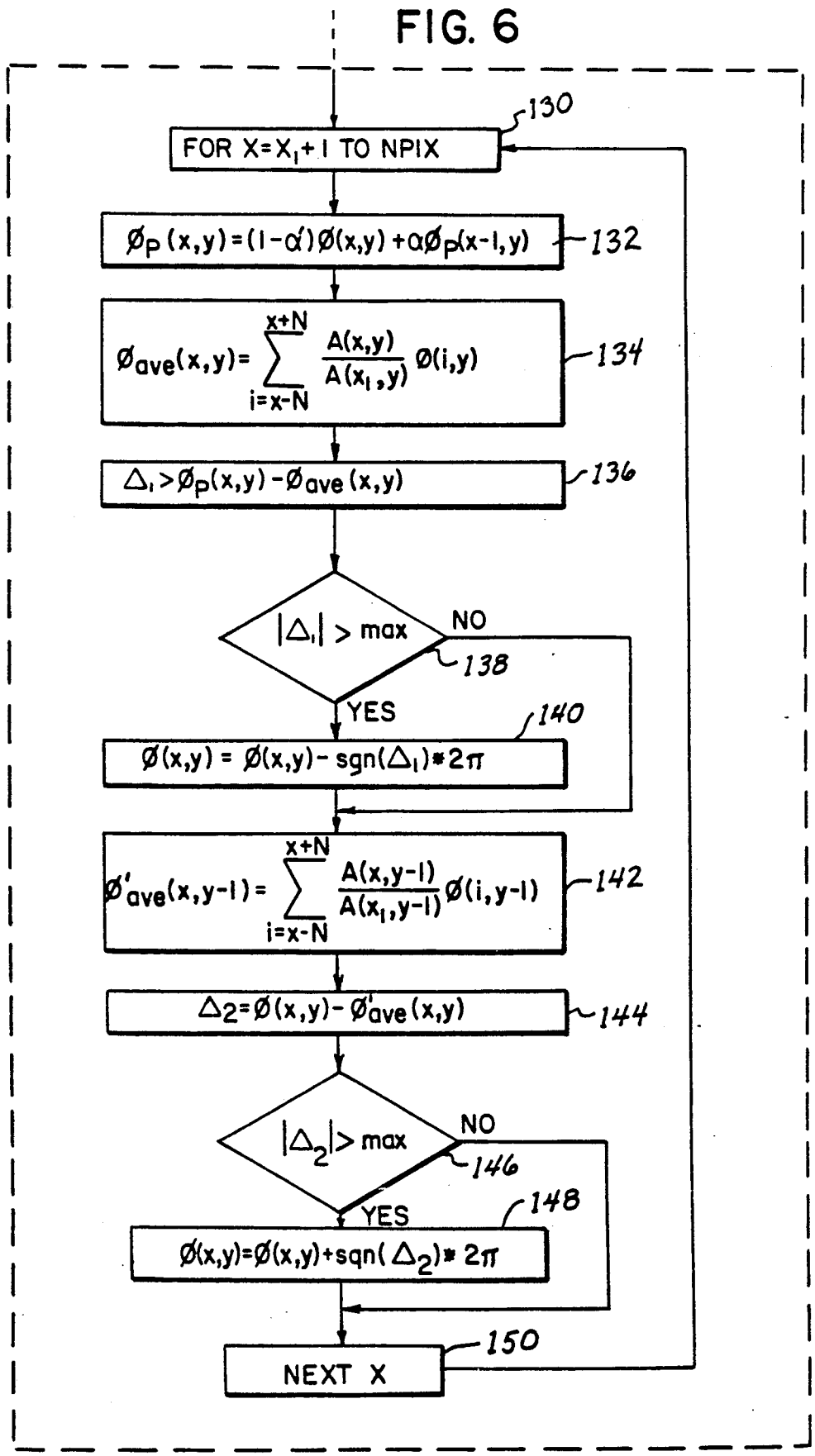
FIG. 6 is a detailed flow chart showing a representative unwrapping stage of FIG. 5.

Referring to FIG. 6, the unwrapping process of process block 108, as is representative of the processes used in process blocks 110, 118 and 120, examines the phase of each voxel on the given y line starting at voxel adjacent to voxel $x_1$. This examination is controlled by a loop formed by process blocks 130 and 150. The first step within this loop as indicated by process block 132 is to predict the phase $\phi_p$ at the current voxel by reference to the previous voxel as follows:

$$\phi_p(x, y) = (1 - \alpha')\phi(x, y) + \alpha' \phi_p(x-1, y) \quad (31)$$

where $1 - \alpha' = (1 - \alpha)[(|S_{0'}(x, y)|/|S_{0'}(x_m, y)|)] \quad (32)$ $\alpha = 0.6$ and $\quad (33)$ $x_m$ is the voxel on the current line of maximum amplitude $|S_{0'}|$. This step is a weighted trend prediction.

It will be apparent to those of ordinary skill in the art that other values of $\alpha$ may be selected such that $0 \leq \alpha \leq 1$ where larger values of $\alpha$ will provide a prediction $\phi_p$ that conforms more slowly to the actual measured phase $\phi$. The weighting of $\alpha$ by the amplitude of the image $|S_{0'}|$ causes the prediction $\phi_p$ to use little of the immediate phase information of $\phi$ when the amplitude is small and instead retains the average from the preceding voxels where the amplitude is high, and thus enables the trend of the phase to be tracked even across a "hole" in the image where the signal is low.

As indicated by process block 134, a rolling weighted average $\phi_{ave}$ of the current phase $\phi$ is maintained for a window of voxels of empirically determined width $2N = 12$ centered about the current voxel x as follows:

$$\phi_{ave}(x, y) = \sum_{i=x-N}^{x+N} \frac{|S_{0'}(x, y)|}{|S_{0'}(x_1, y)|} \phi(i, y) \quad (34)$$

This average is compared to the predicted value $\phi_p$ to generate a first error value $\Delta_1$ as follows:

$$\Delta_1(x, y) = \phi_p(x, y) - \phi_{ave}(x, y) \quad (35)$$

A large value of $\Delta_1$ will indicate a wrap around and hence at decision block 138 if the value of $\Delta_1$ exceeds a predetermined maximum value of $\pi$, then at process block 140, the current phase $\phi$ is unwrapped by adding or subtracting $2\pi$ as follows:

$$\phi(x, y) = \phi(x, y) - sgn(\Delta_1(x, y))^* 2\pi \quad (36)$$

In either case at process block 142 a weighted average $\phi_{ave'}$ is computed for the corresponding voxels on the preceding y-line as follows:

$$\phi_{ave'}(x, y) = \sum_{i=x-N}^{x+N} \frac{|S_{0'}(x, y)|}{|S_{0'}(x_1, y)|} \phi(i, y-1) \quad (37)$$

This average is compared to the current phase value $\phi$ value to generate second error value $\Delta_2(x, y)$ as follows:

$$\Delta_2(x, y) = \phi(x, y) - \phi_{ave'}(x, y) \quad (38)$$

A large value of $\Delta_2(x, y)$ will indicate an additional wrap around and hence at decision block 146 if the value of $\Delta_2$ is not close to zero, i.e. is less than $\pi$ in magnitude, for example, then at process block 148, the current phase $\phi$ is unwrapped by adding or subtracting $2\pi$ as follows:

$$\phi(x, y) = \phi(x, y) - sgn(\Delta_2(x, y))^* 2\pi \quad (39)$$

The next voxel is then examined and the process is repeated per the loop formed by process blocks 130 and 150 as described.

The above techniques thus remove the ambiguity from the determination of $\phi$.

4. A Four Point Technique

In a second embodiment of the present invention, the assumption that the only amplitude loss is caused by susceptibility dephasing is relaxed and the possibility of significant spectral breadth dephasing is included. Therefore, $A_1$ will not necessarily equal $A_2$. With this method, four images will be selected, $S_0$ and three other images having relative phase shifts $\theta$ produced by adjusting $\tau$ so that the images are asymmetric around $S_0$, so as to preserve amplitude loss information, and where at least one of the "other" images has some degree of "congruency" between its fat and water components. Congruency, as before, will be defined as the quality possessed by an image $S_n$ which is not perfectly fat opposed. That is where $\phi$ is not an odd multiple of $\pi$. Again, the qualities of asymmetry and congruency allow the values of A to be determined and improve the $B_0$ map used to compute $\phi$. Again, for computational efficiency, the phase shift values $\theta$ will be integer multiples of $\pi$ however, the present invention should not be construed as limited to such images.

Referring to equation (7), four images $S_n$ having asymmetry and congruency in at least two of the images may be generated by selecting $\tau$ to produce the values of $\pi=0$ $\pi$, $2\pi$ and $3\pi$ as follows:

$$S_0' = (\rho_1 + \rho_2) \quad (40)$$

$$S_1' = (\rho_1 A_1 - \rho_2 A_2)e^{j\phi} \quad (41)$$

$$S_2' = (\rho_1 A_1^2 - \rho_2 A_2^2)e^{j2\phi} \quad (42)$$

$$S_3' = (\rho_1 A_1^3 - \rho_2 A_2^3)e^{j2\phi} \quad (43)$$

As before $$2\phi = arg(S_2) - arg(S_0) \quad (21)$$

and $\phi$ may be determined by the unwrapping procedures described above in sections IV B 3(b) and (c). Also, $S_{n'} = S_n e^{-i\phi_o}$, where as before, $\phi_o = arg(S_0)$.

Once $\phi$ is known, and assuming the amplitude losses are low, i.e $A_1 \approx 1$ and $A_2 \approx 1$ then $\rho_1$ and $\rho_2$ may be approximated to first order as:

$$\rho_1 = S_0'/2 + (3S_1'' - S_3'')/4 \quad (44)$$

$$\rho_2 = S_0'/2 - (3S_1'' - S_3'')/4 \quad (45)$$

where $S_{n'} = S_n e^{-i\phi}$ and $S_{n''} = S_n e^{-1(n\phi + \phi_0)}$ for n=0, 1 and 2.

Also, under the same approximation:

$$A_1 = \{S_1'' + (S_2'' + S_0'')/2\}/2\rho_1 \quad (46)$$

$$A_2 = (\rho_1 A_1 - S_1'')/2\rho_1 \quad (47)$$

Thus, these four equation will provide not only values of $\rho_1$ and $\rho_2$ but values of $A_1$ and $A_2$ provided the amplitude loss caused by these factors is not too large. The amplitude loss factor associated with spectral broadening of the fat component will then be:

$$A_{2w} = \frac{A_2}{A_1} \quad (48)$$

whereas the amplitude loss factor associated susceptibility dephasing common to both species will be $A_1$.

In both the three point and four point methods described above, images are created either of susceptibility loss or both susceptibility loss and spectral broadening loss. It will be understood that the benefit of the present invention in this regard is the ability to calculate susceptibility and spectral broadening and thus to implicitly correct the decomposition of fat and water by these effects and that no visual image need be produced.

While this invention has been described with reference to particular embodiments and examples, other modifications and variations, such as application to projection reconstruction imaging techniques, will occur to those skilled in the art in view of the above teachings. For example, the determination of $\phi(x,y)$ may be made immediately after the first stage of the correction process or alternatively the second stage of the correction process may be used alone. Also, the technique may be used for chemical species other than fat and water. It will also be understood that the phase shift values may be produced by MRI sequences other than those using spin echo and gradient echo sequences. Accordingly, the present invention is not limited to the preferred embodiment described herein, but is instead defined in the following claims.

We claim:

1. A method of producing separate images of a first chemical and second chemical species in an imaged body comprising the steps of:

acquiring at least three complex NMR multi-voxel images of the body, the first and second chemical species having relative phase shifts in the three images such that at least two of the images have congruence in the signals produced by the first and second chemical species;

combining the NMR images to create a $B_0$ image;

fitting a low order surface to the continuous portions of the $B_0$ image;

measuring the difference between the low order surface and the $B_0$ image;

correcting the phase of the $B_0$ image if the difference between adjacent voxels exceeds a predetermined value;

combining the NMR multi-voxel images to produce a first and second chemical species image using the corrected $B_0$ image to identify the predominant chemical species of each voxel in the chemical species images.

2. The method of claim 1 wherein the fitting of the low order surface to the continuous portions of the $B_0$ image comprises the following steps:

differentiating the $B_0$ image to produce a differentiated image;

producing a weighting function by comparing the value differentiated image at each voxel to a predetermined threshold and setting the weighting function for that voxel equal to zero if that threshold is passed;

fitting a differentiated polynomial to the differentiated $B_0$ image using the weighting function in a weighted curve fitting process; and integrating the differentiated polynomial to produce the low order surface.

3. The method of claim 2 wherein the constant of integration from integrating the differentiated polynomial is set equal to the measured phase at the maximum amplitude voxel for the line at the center of mass in the perpendicular direction of the image.

4. The method of claim 2 wherein the weighting function is proportional to the amplitude of a complex NMR image if the threshold is not passed.

5. The method of claim 1 where the low order surface is a third order polynomial.

6. An apparatus producing separate images of a first chemical and second chemical species in an imaged body comprising:

means for acquiring at least three complex NMR multi-voxel images of the body, the first and second chemical species having relative phase shifts in the three images such that at least two of the images have congruence in the signals produced by the first and second chemical species;

means for combining the NMR images to create a $B_0$ image;

means for fitting a low order surface to the continuous portions of the $B_0$ image;

means for measuring the difference between the low order surface and the $B_0$ image;

means for correcting the phase of the $B_0$ image if the difference between adjacent voxels exceeds a predetermined value;

means for combining the NMR multi-voxel images to produce a first and second chemical species image using the corrected $B_0$ image to identify the predominant chemical species of each voxel in the chemical species images.

* * * * *

UNITED STATES PATENT AND TRADEMARK OFFICE
CERTIFICATE OF CORRECTION

PATENT NO. : 5,225,781
DATED : July 6, 1993
INVENTOR(S) : Gary H. Glover et al.

It is certified that error appears in the above-identified patent and that said Letters Patent is hereby corrected as shown below:

Col. 7, line 25     "$\phi=2\omega\tau$" should be -- $\phi=2\omega_0\tau$ --.

Col. 8, line 65     "and p is the displacement" should be -- and $\tau$ is the displacement --.

Col. 9, line 26     "$e_n^{i\omega\tau}$" should be -- $e^{i\omega\tau}{}_n$ --.

Col. 9, line 34     "$X(\tau)/X(o)$" should be -- $\hat{X}(\tau)/\hat{X}(o)$ --.

Col. 9, line 36     "$X = F(X)$" should be -- $\hat{X} = F(X)$ --.

Col. 10, line 7     "$L = F(L)$" should be -- $\hat{L} = F(L)$ --.

Col. 10, line 38     "equal magnitude" should be -- equal in magnitude --.

Col. 15, line 52     $S_{n'} = S_n e^{-i\phi}$ and should be -- $S_{n'} = S_n e^{-i\phi_0}$ and --.

UNITED STATES PATENT AND TRADEMARK OFFICE
CERTIFICATE OF CORRECTION

PATENT NO. : 5,225,781
DATED : July 6, 1993
INVENTOR(S) : Gary H. Glover et al

It is certified that error appears in the above-indentified patent and that said Letters Patent is hereby corrected as shown below:

Col. 15, line 56   "+ (S2" + S")" should be -- + (S2" + S0')--.

Signed and Sealed this

Seventeenth Day of May, 1994

Attest:

BRUCE LEHMAN

*Attesting Officer*        *Commissioner of Patents and Trademarks*